US012685170B2

(12) United States Patent
Zhang

(10) Patent No.: US 12,685,170 B2
(45) Date of Patent: Jul. 14, 2026

(54) DISPLAY PANEL AND MOBILE TERMINAL WITH CRACK-MITIGATING ENCAPSULATION STRUCTURE

(71) Applicants: WUHAN CHINA STAR OPTOELECTRONICS TECHNOLOGY CO., LTD., Wuhan (CN); WUHAN CHINA STAR SEMICONDUCTOR DISPLAY TECHNOLOGY CO., LTD., Wuhan (CN)

(72) Inventor: Xingyong Zhang, Wuhan (CN)

(73) Assignees: WUHAN CHINA STAR OPTOELECTRONICS TECHNOLOGY CO., LTD., Wuhan (CN); WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 1328 days.

(21) Appl. No.: 17/598,266

(22) PCT Filed: Jul. 13, 2021

(86) PCT No.: PCT/CN2021/105901
§ 371 (c)(1),
(2) Date: Dec. 22, 2022

(87) PCT Pub. No.: WO2022/262033
PCT Pub. Date: Dec. 22, 2022

(65) Prior Publication Data
US 2024/0047378 A1 Feb. 8, 2024

(30) Foreign Application Priority Data
Jun. 16, 2021 (CN) .......................... 202110666052.2

(51) Int. Cl.
*H01L 23/00* (2006.01)
*G06F 3/041* (2006.01)
(Continued)

(52) U.S. Cl.
CPC ........ *H10W 42/121* (2026.01); *G06F 3/0412* (2013.01); *H10W 74/147* (2026.01)

(58) Field of Classification Search
CPC .. G06F 3/0446; G06F 3/0412; G06F 3/04164; H01L 23/562
See application file for complete search history.

(56) References Cited

U.S. PATENT DOCUMENTS 10,553,656 B2 * 2/2020 Won ...................... H10K 59/873
2020/0127228 A1 4/2020 Huang

FOREIGN PATENT DOCUMENTS

CN 107180923 A 9/2017
CN 108281570 A 7/2018
(Continued)

OTHER PUBLICATIONS

Chinese Office Action issued in corresponding Chinese Patent Application No. 202110666052.2 dated Apr. 21, 2022, pp. 1-9.
(Continued)

*Primary Examiner* — Joseph L Williams
(74) *Attorney, Agent, or Firm* — PV IP PC; Peter Stecher; Wei Te Chung

(57) ABSTRACT

A display panel and a mobile terminal are provided. The display panel includes a substrate and multiple barrier units spaced apart from each other in a peripheral area, openings defined between adjacent barrier units, and a first array encapsulation unit and a second array encapsulation unit separate from each other. Each barrier unit has end surfaces with different areas in a thickness direction, and encapsulation films are interrupted at the openings between adjacent
(Continued)

barrier units. The above configuration prevents cracks from extending from the peripheral area into the display area.

14 Claims, 3 Drawing Sheets

(51) Int. Cl.
| | |
|---|---|
| *H01L 23/31* | (2006.01) |
| *H10W 42/00* | (2026.01) |
| *H10W 74/10* | (2026.01) |

(56) References Cited

FOREIGN PATENT DOCUMENTS

| CN | 109103346 A | 12/2018 |
|---|---|---|
| CN | 109216576 A | 1/2019 |
| CN | 110518046 A | 11/2019 |
| CN | 111415965 A | 7/2020 |
| CN | 111725425 A | 9/2020 |
| CN | 111816665 A | 10/2020 |
| CN | 112018045 A | 12/2020 |
| CN | 112420954 A | 2/2021 |
| CN | 112467053 A | 3/2021 |
| CN | 112786804 A | 5/2021 |
| CN | 112835473 A | 5/2021 |
| CN | 112905050 A | 6/2021 |

OTHER PUBLICATIONS

International Search Report in International application No. PCT/CN2021/105901, mailed on Feb. 28, 2022.
Written Opinion of the International Searching Authority in International application No. PCT/CN2021/105901, mailed on Feb. 28, 2022.

* cited by examiner

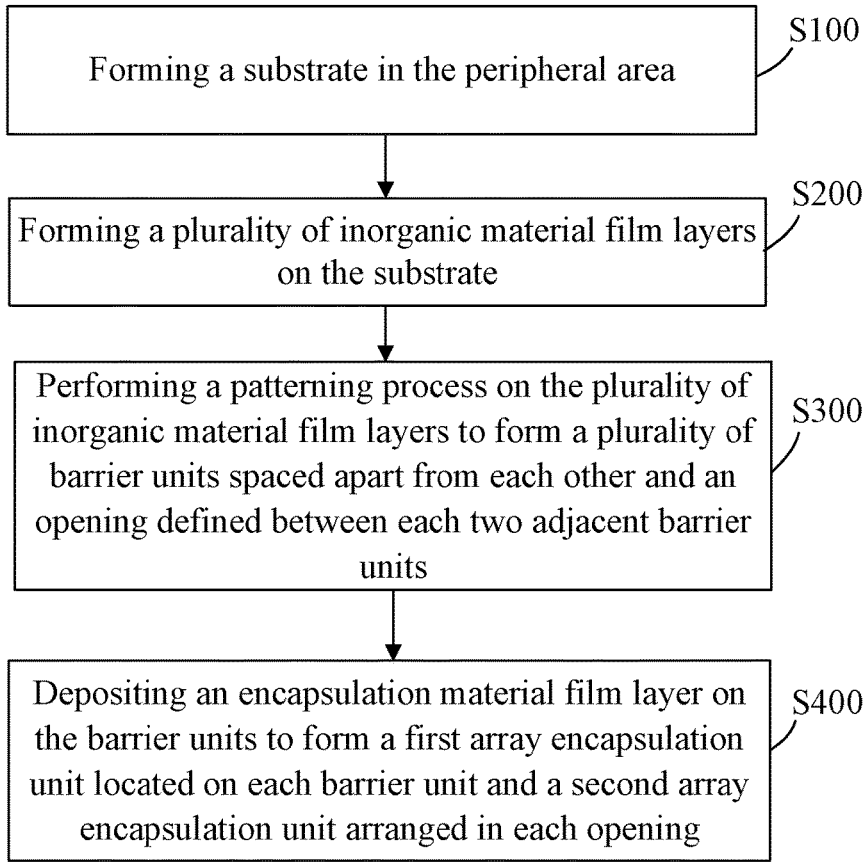

| | |
|---|---|
| Forming a substrate in the peripheral area | S100 |
| Forming a plurality of inorganic material film layers on the substrate | S200 |
| Performing a patterning process on the plurality of inorganic material film layers to form a plurality of barrier units spaced apart from each other and an opening defined between each two adjacent barrier units | S300 |
| Depositing an encapsulation material film layer on the barrier units to form a first array encapsulation unit located on each barrier unit and a second array encapsulation unit arranged in each opening | S400 |

FIG. 8

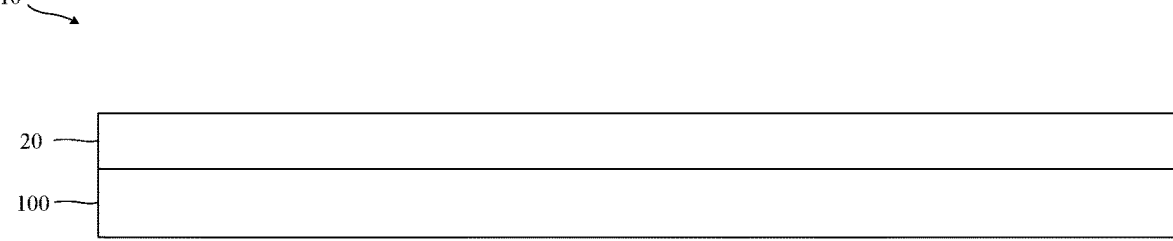

FIG. 9

DISPLAY PANEL AND MOBILE TERMINAL WITH CRACK-MITIGATING ENCAPSULATION STRUCTURE

RELATED APPLICATIONS

This application is a Notional Phase of PCT Patent Application No. PCT/CN2021/105901 having international filing date of Jul. 13, 2021, which claims the benefit of priority of Chinese Patent Application No. 202110666052.2 filed on Jun. 16, 2021. The contents of the above applications are all incorporated by reference as if fully set forth herein in their entirety.

FIELD OF DISCLOSURE

The present application relates to a field of display technology and in particular, to a display panel and a mobile terminal.

DESCRIPTION OF RELATED ART

In recent years, service lives of display panels are getting more attention. During cutting of the display panel, an inorganic encapsulation layer of the display panel in a peripheral area is easily damaged and generates cracks. The cracks extended to a display area result in poor encapsulation. The inorganic encapsulation layer usually comprises multiple inorganic layers, and hence has a greater thickness, so the inorganic encapsulation layer is more likely to be damaged and generate cracks.

Therefore, there is an urgent need to provide a display panel and a mobile terminal which can solve the above technical problems.

SUMMARY

The present invention provides a display panel and a mobile terminal, which can alleviate a conventional problem that an inorganic encapsulation layer is easily damaged and generates cracks when the display panel is cut. The cracks extended to a display area cause poor encapsulation.

Accordingly, the present application provides technical solutions as follows:

The present application provides a display panel, comprising:

a display area and a peripheral area arranged at a periphery of the display area;

a substrate and an encapsulation component arranged on the substrate in the peripheral area, wherein the encapsulation component comprises a plurality of barrier units spaced apart from each other, an encapsulation member, and an opening defined between each two adjacent ones of the barrier units; and the encapsulation member comprises a first array encapsulation unit arranged on each barrier unit and a second array encapsulation unit arranged in each opening;

wherein the first array encapsulation unit and the second array encapsulation unit are separate from each other; and in each barrier unit, an area of an end surface of the barrier unit close to the substrate is smaller than an area of an end surface of the barrier unit away from the substrate.

According to one embodiment, the barrier units comprise a first inorganic layer disposed on the substrate and a second inorganic layer disposed on the first inorganic layer; and a thickness of each first array encapsulation unit is equal to a thickness of each second array encapsulation unit.

According to one embodiment, the display panel further comprises a covering unit arranged on the barrier units, and the covering unit fills the opening between each two adjacent ones of the barrier units.

According to one embodiment, the display panel further comprises an array substrate encapsulation layer disposed in the display area, wherein a thickness of the array substrate encapsulation layer is equal to the thickness of each first array encapsulation unit, and the thickness of the array substrate encapsulation layer is equal to the thickness of each second array encapsulation unit.

According to one embodiment, the display panel further comprises a plurality of dams arranged between the second inorganic layer and the array substrate encapsulation layer and located on one side of the display area close to the peripheral area.

According to one embodiment, the encapsulation member further comprises a touch encapsulation layer disposed on the covering unit, the touch encapsulation layer is also located in the display area, and an orthographic projection of the touch encapsulation layer in the peripheral area projected on the covering unit is located within the covering unit.

According to one embodiment, the encapsulation member further comprises a first touch encapsulation unit disposed on the first array encapsulation unit and a second touch encapsulation unit disposed on the second array encapsulation unit, and the first touch encapsulation unit and the second touch encapsulation unit are separate from each other.

According to one embodiment, each of the barrier units comprises a side wall, the side wall is disposed corresponding to one of the openings, and the side wall is an arc surface recessed toward a center of the barrier unit.

According to one embodiment, sizes of the openings gradually increase in a direction away from the display area.

According to one embodiment, the encapsulation member on one side close to the display area is connected to a plurality of encapsulation film layers in the display area.

The present application further provides a mobile terminal, comprising:

a display panel and a terminal body, wherein the terminal body and the display panel are combined into one body, and the display panel comprises a display area and a peripheral area arranged at a periphery of the display area;

wherein the display panel comprises a substrate and an encapsulation component arranged on the substrate in the peripheral area; the encapsulation component comprises a plurality of barrier units spaced apart from each other, an encapsulation member, and an opening defined between each two adjacent ones of the barrier units; and the encapsulation member comprises a first array encapsulation unit arranged on each barrier unit and a second array encapsulation unit arranged in each opening;

wherein the first array encapsulation unit and the second array encapsulation unit are separate from each other; and in each barrier unit, an area of an end surface of the barrier unit close to the substrate is smaller than an area of an end surface of the barrier unit away from the substrate.

According to one embodiment, the barrier units comprise a first inorganic layer disposed on the substrate and a second inorganic layer disposed on the first inorganic layer; and a thickness of each first array encapsulation unit is same as a thickness of each second array encapsulation unit.

According to one embodiment, the display panel further comprises a covering unit arranged on the barrier units, and the covering unit fills the opening between each two adjacent ones of the barrier units.

According to one embodiment, the display panel further comprises an array substrate encapsulation layer disposed in the display area; and a thickness of the array substrate encapsulation layer is same as the thickness of each first array encapsulation unit, and the thickness of the array substrate encapsulation layer is same as the thickness of each second array encapsulation unit.

According to one embodiment, the display panel further comprises a plurality of dams arranged between the second inorganic layer and the array substrate encapsulation layer and located on one side of the display area close to the peripheral area.

According to one embodiment, the encapsulation member further comprises a touch encapsulation layer disposed on the covering unit, the touch encapsulation layer is located in the display area, and an orthographic projection of the touch encapsulation layer in the peripheral area projected on the covering unit is located within the covering unit.

According to one embodiment, the encapsulation member further comprises a first touch encapsulation unit disposed on the first array encapsulation unit and a second touch encapsulation unit disposed on the second array encapsulation unit, and the first touch encapsulation unit and the second touch encapsulation unit are separate from each other.

According to one embodiment, each of the barrier units comprises a side wall, the side wall is disposed corresponding to one of the openings, and the side wall is an arc surface recessed toward a center of the barrier unit.

According to one embodiment, sizes of the openings gradually increase in a direction away from the display area.

According to one embodiment, the encapsulation member on one side close to the display area is connected to a plurality of encapsulation film layers in the display area.

Advantages of the Present Application

In the present invention, the barrier units with upper and lower end surfaces of different areas are arranged in the peripheral area. Accordingly, when the encapsulation film layers are formed, the encapsulation film layers are broken in the opening between each two adjacent barrier units. As a result, even if cracks are generated when the display panel is cut, the cracks do not extend to the display area, thus ensuring encapsulation effects and improving production yields of the display panel.

BRIEF DESCRIPTION OF DRAWINGS

FIG. 8 is a process flow diagram illustrating a manufacturing method of the display panel according to one embodiment of the present invention.

FIG. 9 is a schematic structural view illustrating a mobile terminal according to one embodiment of the present invention.

DETAILED DESCRIPTION OF EMBODIMENTS

The present application provides a display panel and a mobile terminal. In order to make the purposes, technical solutions, and functions of the present application clearer and more definite, the present application is described in detail below with reference to the accompanying drawings and specific embodiments. It should be understood that the specific embodiments described here are only used to explain the present application, and are not used to limit the present application.

The present application provides a display panel and a manufacturing method thereof. Detailed descriptions are given below. It should be noted that an order of descriptions in the following embodiments is not meant to limit a preferred order of the embodiments.

Figure 1:
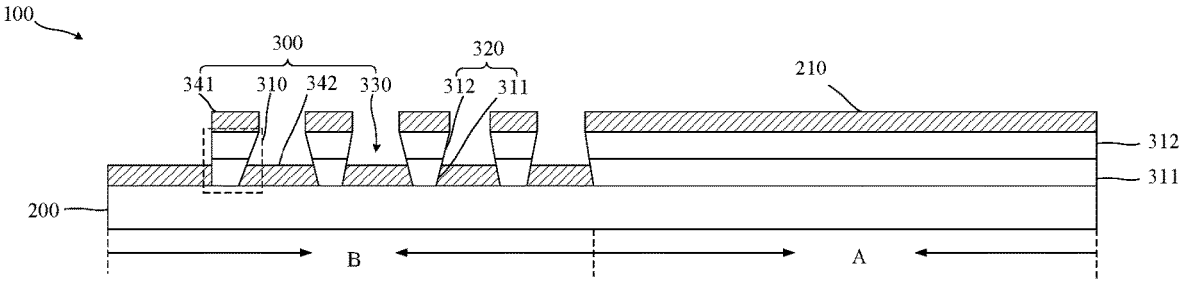
FIG. 1 is a schematic structural view illustrating a display panel according to a first embodiment of the present invention.
Figure 2:
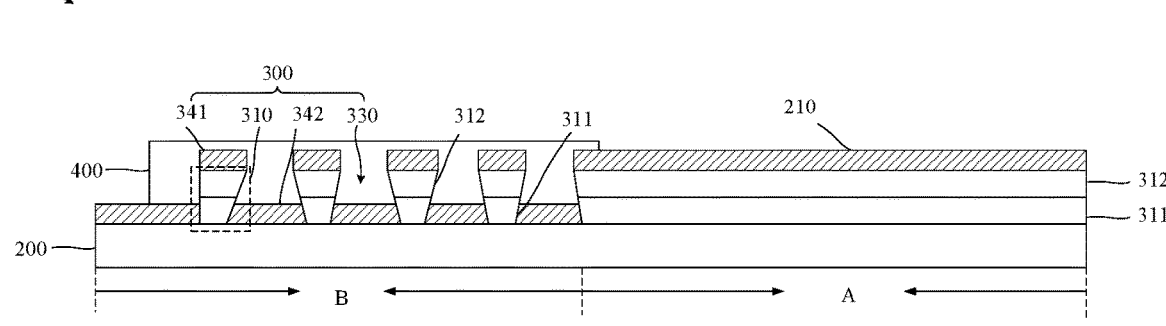
FIG. 2 is a schematic structural view illustrating the display panel according to a second embodiment of the present invention.
Figure 3:
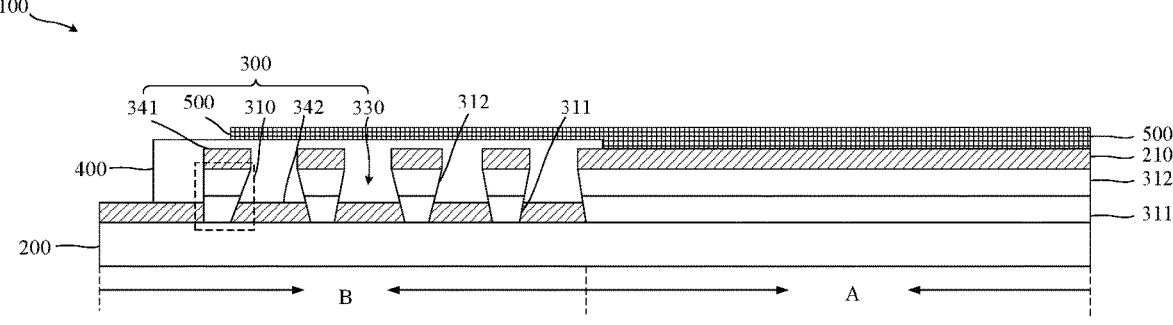
FIG. 3 is a schematic structural view illustrating the display panel according to a third embodiment of the present invention.
Figure 4:
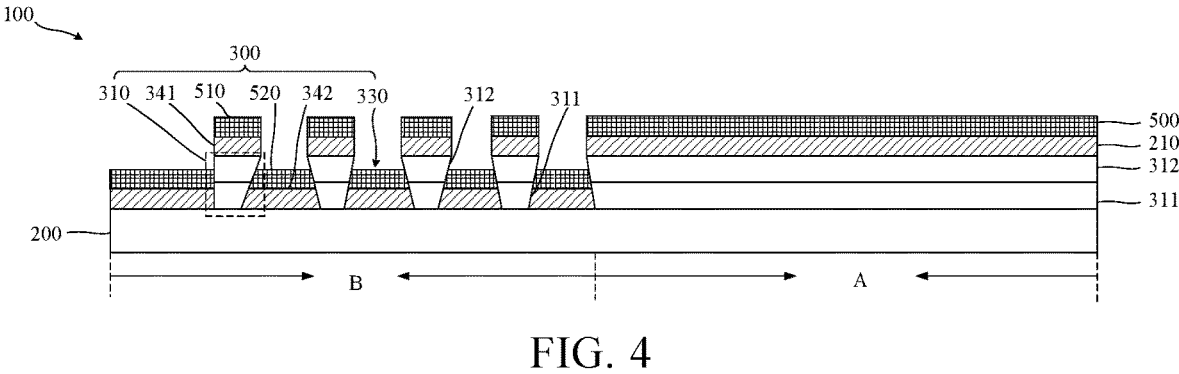
FIG. 4 is a schematic structural view illustrating the display panel according to a fourth embodiment of the present invention.
Figure 5:
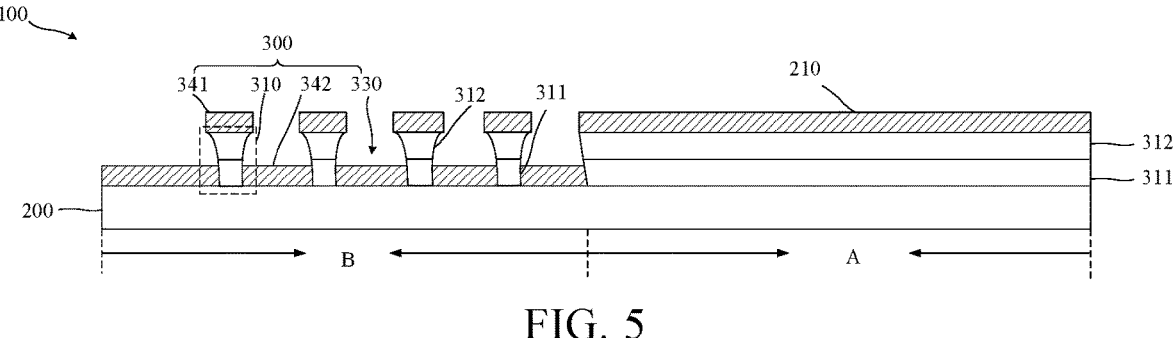
FIG. 5 is a schematic structural view illustrating the display panel according to a fifth embodiment of the present invention.
Figure 6:
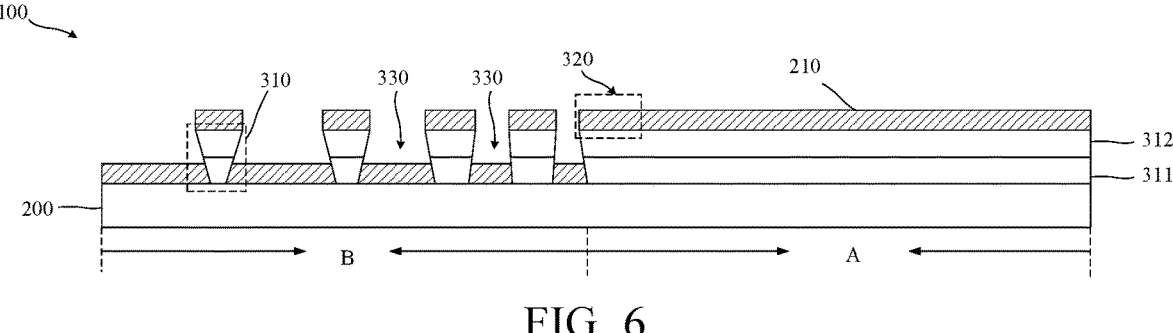
FIG. 6 is a schematic structural view illustrating the display panel according to a sixth embodiment of the present invention.
Figure 7:
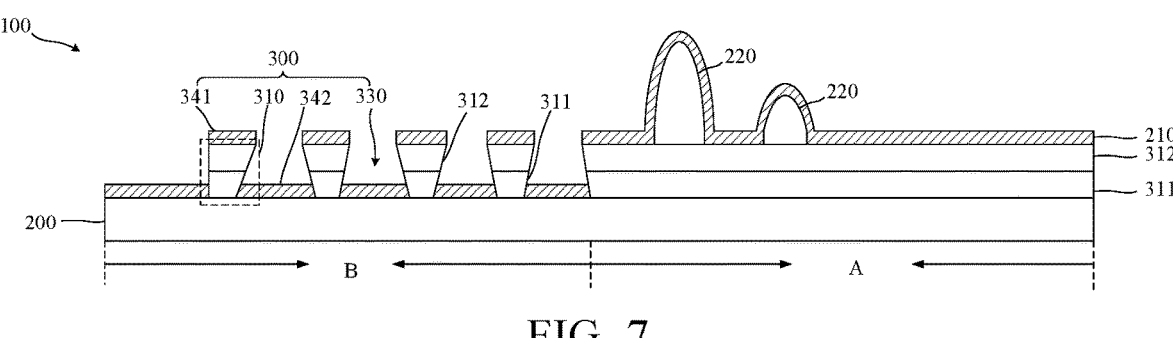
FIG. 7 is a schematic structural view illustrating the display panel according to a seventh embodiment of the present invention.

Referring to FIGS. 1 to 7, the present invention provides a display panel 100, comprising:

a display area A and a peripheral area B arranged at a periphery of the display area A; and a substrate 200 and an encapsulation component 300 arranged on the substrate 200 in the peripheral area B;

wherein the encapsulation component 300 comprises a plurality of barrier units 310 spaced apart from each other, an encapsulation member, and an opening 330 defined between each two adjacent ones of the barrier units 310; and the encapsulation member comprises a first array encapsulation unit 341 arranged on each barrier unit 310 and a second array encapsulation unit 342 arranged in the opening 330;

wherein the first array encapsulation unit 341 and the second array encapsulation unit 342 are separate from each other; and in each barrier unit, an area of an end surface of the barrier unit 310 close to the substrate 200 is smaller than an area of an end surface of the barrier unit 310 away from the substrate 200.

In the present invention, the barrier units with upper and lower end surfaces of different areas are arranged in the peripheral area. Accordingly, when encapsulation film layers are formed, the encapsulation film layers are disconnected in the opening between each two adjacent barrier units. As a result, even if cracks are generated when the display panel is cut, the cracks do not extend to the display area, thereby ensuring encapsulation effects and improving production yields of the display panel.

Technical solutions of the present invention are described in conjunction with specific embodiments.

The display panel 100 comprises a display area A and a peripheral area B located at a periphery of the display area A; a substrate 200 and an encapsulation component 300 arranged on the substrate 200 in the peripheral area B. The encapsulation component 300 comprises a plurality of barrier units 310 spaced apart from each other, an encapsulation member, and an opening 330 defined between each two adjacent ones of the barrier units 310. The encapsulation member comprises a first array encapsulation unit 341 arranged on each barrier unit 310 and a second array encapsulation unit 342 located between each two adjacent barrier units 310 and arranged in the opening 330. The first array encapsulation unit 341 and the second array encapsulation unit 342 are separate from each other. In each barrier unit, an area of an end surface of the barrier unit 310 close to the substrate 200 is smaller than an area of an end surface of the barrier unit 310 away from the substrate 200. Please refer to FIG. 1 for details.

In the present embodiment, the barrier units 310 comprise a first inorganic layer 311 disposed on the substrate 200 and a second inorganic layer 312 disposed on the first inorganic layer 311. A thickness of each first array encapsulation unit 341 is same as a thickness of each second array encapsulation unit 342. Please refer to FIG. 1 for details. The first array encapsulation unit 341 and the second array encapsulation unit 342 are formed when encapsulation film layers are formed, and the encapsulation film layers are disconnected at the barrier units 310 and the openings 330 to form the first array encapsulation units 341 and the second array encapsulation units 342 separate from each other, so the thickness of each first array encapsulation unit 341 is same as the thickness of each second array encapsulation unit 342. The first inorganic layer 311 and the second inorganic layer 312 can be inorganic film layers in an array substrate of the display panel 100. For example, the first inorganic layer 311 can be an insulating layer, a material of the first inorganic layer 311 can be a silicon-nitrogen compound or/and a silicon-oxygen compound, the second inorganic layer 312 can be a passivation layer, and a material of the second inorganic layer 312 can be a silicon-nitrogen compound or/and a silicon-oxygen compound; however, the present application is not limited in this regard.

In the present embodiment, the substrate 200 is located in the display area A and the peripheral area B, and the first inorganic layer 311 and the second inorganic layer 312 extend into the display area A. For details, please refer to FIG. 1. The display panel 100 further comprises an array substrate disposed on the substrate 200 and an array substrate encapsulation layer 210 disposed on the array substrate. The array substrate and the array substrate encapsulation layer 210 are located in the display area A.

In the present embodiment, the array substrate comprises the first inorganic layer 311 and the second inorganic layer 312. Please refer to FIG. 1 for details.

In the present embodiment, the display panel 100 further comprises a covering unit 400 arranged on the barrier units 310, and the covering unit 400 fills the opening 330 between each two adjacent ones of the barrier units 310. Please refer to FIG. 2 for details. The covering unit 400 can be an organic material, which can provide certain flexibility in the peripheral area B and reduce a risk of cracks extension, and can also improve the encapsulation effects of the encapsulation component 300.

In the present embodiment, the display panel 100 further comprises an array substrate encapsulation layer 210 disposed in the display area A. A thickness of the array substrate encapsulation layer 210 is equal to the thickness of the first array encapsulation unit 341, and the thickness of the array substrate encapsulation layer 210 is equal to the thickness of the second array encapsulation unit 342. Please refer to FIGS. 1 and 2 for details. The first array encapsulation unit 341 and the second array encapsulation unit 342 can be formed at the same time when the array substrate encapsulation layer 210 is formed, so the first array encapsulation unit 341, the second array encapsulation unit 342, and the array substrate encapsulation layer 210 have the same thicknesses. The first array encapsulation units 341 remain on the barrier units 310, the first array encapsulation units 341 and the array substrate encapsulation layer 210 close to the peripheral area B can be arranged in a same layer.

In the present embodiment, the encapsulation member further comprises a touch encapsulation layer 500 disposed on the covering unit 400, the touch encapsulation layer 500 is also located in the display area A, and an orthographic projection of the touch encapsulation layer 500 in the peripheral area B projected on the covering unit 400 is within the covering unit 400. Please refer to FIG. 3 for details. The display panel 100 further comprises related structures of the touch encapsulation layer 500. The touch encapsulation layer 500 is located on the covering unit 400 and extends into the display area A, and provides an encapsulation protection on a touch structure of the display panel 100. During manufacturing of the display panel 100, the touch encapsulation layer 500 is etched to etch away a portion of the touch encapsulation layer 500 away from the display area A. As a result, when the display panel 100 is cut, the present application reduces a risk of cracking of the touch encapsulation layer 500 at locations of cutting, and fundamentally reduces a risk of the cracks extending to the display area A of the display panel 100.

In the present embodiment, the encapsulation member further comprises a first touch encapsulation unit 510 disposed on each first array encapsulation unit 341 and a second touch encapsulation unit 520 disposed on each second array encapsulation unit 342. The first touch encapsulation unit 510 and the second touch encapsulation unit 520 are separate from each other. Please refer to FIG. 4 for details. After the first array encapsulation unit 341 and the second array encapsulation unit 342 are formed, the touch encapsulation layer 500 is formed. At this point, due to the presence of the barrier units 310 and the openings 330, the touch encapsulation layer 500 spontaneously breaks into the first touch encapsulation units 510 on the first array encapsulation units 341 and the second touch encapsulation units 520 in the openings 330. During a subsequent manufacturing process, the covering unit 400 can be formed on the first touch encapsulation units 510 and fill the openings 330, or alternatively, manufacturing of the covering unit 400 can be omitted. A step of etching the touch encapsulation layer 500 can also be omitted. Even if cracks are generated when the display panel 100 is cut, the cracks do not extend to the display area A.

In the present embodiment, the barrier unit 310 comprises a side wall, the side wall is disposed corresponding to the opening 330, and the side wall is an arc surface recessed toward a center of the barrier unit 310. Please refer to FIG. 5 for details. This structure enhances a probability of the encapsulation film layers breaking spontaneously in the openings 330, such that it can be ensured that the encapsulation film layers in the peripheral area B be separate from the encapsulation film layers in the display area A.

In the present embodiment, in a direction away from the display area A, sizes of the openings 330 gradually increase. Please refer to FIG. 6 for details. The opening 330 with the larger size can increase the probability of the encapsulation film layers breaking spontaneously in the opening 330, such that it can be ensured the encapsulation film layers in the peripheral area B be separate from the encapsulation film layers in the display area A.

In the present embodiment, the encapsulation member on one side close to the display area A is connected to the encapsulation film layers in the display area A. Please refer to FIG. 6 for details. A boundary between the display area A and the peripheral area B is difficult to distinguish; however, taking the first encapsulation film layer 320 as an example, it can be seen that the encapsulation member on the side close to the display area A is connected to the array substrate encapsulation layer 210 in the display area A. The encapsulation member and the corresponding film layer in the display area A can be formed by a same photomask in a same process, and the encapsulation member can be formed by using the photomask with different light transmittance.

In the present embodiment, in a first cross-section, a cross-sectional area of the barrier unit 310 becomes larger and larger in a direction from the substrate 200 to the covering unit 400, and the first cross-section is parallel to the substrate 200.

In the present embodiment, the side wall of the barrier unit 310 is plane, and in the direction away from the display area A, an angle between the side wall of the barrier unit 310 and the substrate 200 gradually increases. Please refer to FIG. 6 for details. This increases the probability of the encapsulation film layers breaking spontaneously in the openings 330, such that it can be ensure that the encapsulation film layers in the peripheral area B can be separate from the encapsulation film layers in the display area A.

In the present embodiment, a number of a density of the openings 330 gradually increases in the direction away from the display area A, which can increase the probability of the encapsulation film layers breaking in the openings 330, such that it can be ensured that the encapsulation film layers in the peripheral area B can be separate from the encapsulation film layers in the display area A.

In the present embodiment, on one side close to the peripheral area B in the display area A, the display panel 100 further comprises a plurality of dams located between the second inorganic layer 312 and the array substrate encapsulation layer 210. A side surface of the barrier unit 310 close to one side away from the display area A is perpendicular to the substrate 200, which can better prevent intrusion of moisture and oxygen. Please refer to FIG. 7 for details. The dams 220 can be an organic material. In a direction from a center of the display panel 100 to the peripheral area B, thicknesses of the dams 220 gradually increase, so the dams 220 can better prevent entry of moisture and oxygen.

In the present invention, the barrier units with upper and lower end surfaces of different areas are arranged in the peripheral area. When the encapsulation film layers are formed, the encapsulation film layers are broken in the opening between each two adjacent barrier units. Even if cracks are generated when the display panel is cut, the cracks do not extend to the display area, thus ensuring the encapsulation effects and improving production yields of the display panel.

Referring to FIG. 8, the present invention also provides a manufacturing method of a display panel 100. The display panel 100 comprises a display area A and a peripheral area B located at a periphery of the display area A. The manufacturing method of the display panel 100 comprises:

S100: forming a substrate 200 in the peripheral area B.

S200: forming a plurality of inorganic material film layers on the substrate 200.

S300: performing a patterning process on the plurality of inorganic material film layers to form a plurality of barrier units 310 spaced apart from each other and an opening 330 defined between each two adjacent barrier units 310.

S400: depositing an encapsulation material film layer on the barrier units 310 to form a first array encapsulation unit 341 located on each barrier unit 310 and a second array encapsulation unit 342 arranged in each opening 330;

An area of an end surface of each barrier unit 310 close to the substrate 200 is smaller than an area of an end surface of each barrier unit 310 away from the substrate 200. The first array encapsulation units 341 and the second array encapsulation units 342 are separate from each other.

In the present invention, the barrier units with upper and lower end surfaces of different areas are arranged in the peripheral area. Therefore, when the encapsulation film layers are formed, the encapsulation film layers are broken in the opening between each two adjacent barrier units. As a result, even if cracks are generated when the display panel is cut, the cracks do not extend to the display area, thus ensuring encapsulation effects and improving production yields of the display panel.

The technical solution of the present invention is described in conjunction with specific embodiments.

The manufacturing method of the display panel 100 comprises:

S100: forming the substrate 200 in the peripheral area B.

In the present embodiment, step S100 comprises:

S110: forming the substrate 200 in the peripheral area B and the display area A.

S200: forming the plurality of inorganic material film layers on the substrate 200.

In the present embodiment, step S200 comprises:

S210: forming an array substrate on the substrate 200.

In the present embodiment, the first inorganic layer 311 and the second inorganic layer 312 can be the inorganic film layers in the array substrate of the display panel 100. For example, the first inorganic layer 311 can be an insulating layer; a material of the first inorganic layer 311 can be a silicon-nitrogen compound or/and a silicon-oxygen compound; the second inorganic layer 312 can be a passivation layer; and a material of the second inorganic layer 312 can be a silicon-nitrogen compound or/and a silicon-oxygen compound. However, the present application is not limited in this regard.

In the present embodiment, the inorganic material film layers located on the substrate 200 in the peripheral region B can form the first layer and the second layer, that is, the barrier units 310.

In the present embodiment, step S210 comprises:

S211: forming the plurality of inorganic material film layers on the substrate 200.

Step S300: performing the patterning process on the inorganic material film layer to form the barrier units 310 spaced apart from each other and the opening 330 defined between each two adjacent barrier units 310.

In the present embodiment, the barrier units 310 comprise the first inorganic layer 311 disposed on the substrate 200 and the second inorganic layer 312 disposed on the first inorganic layer 311. A thickness of each first array encapsulation unit 341 is equal to a thickness of the second array encapsulation unit 342. Please refer to FIG. 1 for details. The first array encapsulation units 341 and the second array encapsulation units 342 are formed when the encapsulation film layers are formed. The encapsulation film layers are broken at the barrier units 310 and the openings 330 to form the first array encapsulation units 341 and the second array encapsulation units 342 separate from each other. As a result, the thickness of each first array encapsulation unit 341 is equal to the thickness of each second array encapsulation unit 342. The first inorganic layer 311 and the second inorganic layer 312 can be inorganic film layers in the array substrate of the display panel 100. For example, the first inorganic layer 311 can be an insulating layer; a material of the first inorganic layer 311 can be a silicon-nitrogen compound or/and a silicon-oxygen compound; the second inorganic layer 312 can be a passivation layer; and a material of the second inorganic layer 312 can be a silicon-nitrogen compound or/and a silicon-oxygen compound. However, the present application is not limited in this regard.

In the present embodiment, the substrate 200 is disposed in the display area A and the peripheral area B. The first inorganic layer 311 and the second inorganic layer 312 extend into the display area A. Please refer to FIG. 1 for details. The display panel 100 further comprises an array substrate disposed on the substrate 200 and an array substrate encapsulation layer 210 disposed on the array substrate. The array substrate and the array substrate encapsulation layer 210 are disposed in the display area A.

In the present embodiment, the array substrate comprises the first inorganic layer 311 and the second inorganic layer 312. Please refer to FIG. 1 for details.

In the present embodiment, the display panel 100 further comprises a covering unit 400 disposed on the barrier units 310, and the covering unit 400 fills the opening 330 each between each two adjacent barrier units 310. Please refer to FIG. 2 for details. The covering unit 400 can be an organic material, which can provide certain flexibility in the peripheral area B, reduce a risk of cracks extension, and also improve encapsulation effects of the encapsulation component 300.

In the present embodiment, the display panel 100 further comprises the array substrate encapsulation layer 210 disposed in the display area A. A thickness of the array substrate encapsulation layer 210 is equal to the thickness of each first array encapsulation unit 341. The thickness of the array substrate encapsulation layer 210 is equal to the thickness of each second array encapsulation unit 342. Please refer to FIGS. 1 and 2 for details. The first array encapsulation units 341 and the second array encapsulation units 342 can be formed at the same time when the array substrate encapsulation layer 210 is formed. Therefore, the thicknesses of the first array encapsulation units 341, the second array encapsulation units 342, and the array substrate encapsulation layer 210 are the same. The first array encapsulation unit 341 remains on the barrier unit 310. The first array encapsulation units 341 can be arranged in a same layer as the array substrate encapsulation layer 210 close to the peripheral area B.

In the present embodiment, the encapsulation member further comprises a touch encapsulation layer 500 disposed on the covering unit 400, and the touch encapsulation layer 500 is also disposed in the display area A. An orthographic projection of the touch encapsulation layer 500 in the peripheral area B projected on the covering unit 400 is located within the covering unit 400. Please refer to FIG. 3 for details. The display panel 100 also comprises related structures of the touch encapsulation layer 500. The touch encapsulation layer 500 is located on the covering unit 400 and extends into the display area A to provide an encapsulation protection on a touch structure of the display panel 100. During manufacturing of the display panel 100, the touch encapsulation layer 500 is etched to etch away a portion of the touch encapsulation layer 500 away from the display area A. As a result, when the display panel 100 is cut, the present application reduces a risk of cracking of the touch encapsulation layer 500 at locations of cutting, and fundamentally reduces a risk of the cracks extending to the display area A of the display panel 100.

In the present embodiment, the encapsulation member further comprises a first touch encapsulation unit 510 disposed on each first array encapsulation unit 341 and a second touch encapsulation unit 520 disposed on each second array encapsulation unit 342. The first touch encapsulation units 510 and the second touch encapsulation units 520 are separate from each other. Please refer to FIG. 4 for details. After the first array encapsulation units 341 and the second array encapsulation units 342 are formed, the touch encapsulation layer 500 is formed. At this point, due to the presence of the barrier units 310 and the openings 330, the touch encapsulation layer 500 spontaneously breaks into the first touch encapsulation unit 510 on each first array encapsulation unit 341 and the second touch encapsulation unit 520 in each opening 330. During a subsequent manufacturing process, the covering unit 400 can be formed on the first touch encapsulation units 510 and fill the openings 330, or alternatively, manufacturing of the covering unit 400 can be omitted. A step of etching the touch encapsulation layer 500 can also be omitted. Even if cracks are generated when the display panel 100 is cut, the cracks do not extend to the display area A.

In the present embodiment, the barrier unit 310 comprises a side wall, the side wall is disposed corresponding to the opening 330, and the side wall is an arc surface recessed toward a center of the barrier unit 310. Please refer to FIG. 5 for details. This structure enhances a probability of the encapsulation film layers breaking spontaneously in the openings 330, such that it can be ensured that the encapsulation film layers in the peripheral area B can be separate from the encapsulation film layers in the display area A.

In the present embodiment, in a direction away from the display area A, sizes of the openings 330 gradually increase. Please refer to FIG. 6 for details. The opening 330 with a larger size can increase the probability of the encapsulation film layers breaking spontaneously in the openings 330, such that it can be ensured the encapsulation film layers in the peripheral area B can be separate from the encapsulation film layers in the display area A.

S400: depositing the encapsulation material film layer on the barrier unit 310 to form the first array encapsulation unit 341 located on each barrier units 310 and the second array encapsulation unit 342 arranged in each opening 330.

The encapsulation component 300 comprises the plurality of barrier units 310 spaced apart from each other and the encapsulation member. The encapsulation member comprises the first array encapsulation unit 341 arranged on each barrier unit 310 and the second array encapsulation unit 342 located in each opening defined between each two adjacent barrier units 310. Please refer to FIG. 1 for details.

In the present embodiment, the display panel 100 further comprises the array substrate encapsulation layer 210 disposed in the display area A. The thickness of the array substrate encapsulation layer 210 is equal to the thickness of each first array encapsulation unit 341. The thickness of the array substrate encapsulation layer 210 is equal to the thickness of each second array encapsulation unit 342. Please refer to FIG. 1 for details. The first array encapsulation units 341 and the second array encapsulation units 342 can be formed at the same time when the array substrate encapsulation layer 210 is formed. Therefore, the thicknesses of the first array encapsulation units 341, the second array encapsulation units 342, and the array substrate encapsulation layer 210 are the same. The first array encapsulation units 341 remain on the barrier units 310, and the first array encapsulation units 341 can be arranged in a same layer as the array substrate encapsulation layer 210 close to the peripheral area B.

In the present embodiment, the manufacturing method of the display panel 100 further comprises:

S500: forming a covering material film layer on the first array encapsulation units 341 and the second array encapsulation units 342 to form the covering unit 400.

In the present embodiment, the display panel 100 further comprises the covering unit 400 disposed on the barrier units 310, and the covering unit 400 fills the openings 330 between each two adjacent barrier units 310. Please refer to FIG. 2 for details. The covering unit 400 can be an organic material, which can provide certain flexibility in the peripheral region B, reduce a risk of cracks extension, and also improve encapsulation effects of the encapsulation component 300.

In the present embodiment, step S500 comprises:

S510: forming a touch encapsulation material film layer on the first array encapsulation units 341 and the second array encapsulation units 342 to form the touch encapsulation layer 500 comprising the first touch encapsulation units 510 and the second touch encapsulation units 520.

In the present embodiment, the encapsulation member further comprises the first touch encapsulation unit 510 disposed on each first array encapsulation unit 341 and the second touch encapsulation unit 520 disposed on each second array encapsulation unit 342. The first touch encapsulation units 510 and the second touch encapsulation units 520 are separate from each other. Please refer to FIG. 4 for details. After the first array encapsulation units 341 and the second array encapsulation units 342 are formed, the touch encapsulation layer 500 is formed. At this point, due to presence of the barrier units 310 and the openings 330, the touch encapsulation layer 500 spontaneously breaks into the first touch encapsulation unit 510 on each first array encapsulation unit 341 and the second touch encapsulation unit 520 in each opening 330. During a subsequent manufacturing process, the covering unit 400 can be formed on the first touch encapsulation units 510 and fill the openings 330, or alternatively, manufacturing of the covering unit 400 can be omitted. A step of etching the touch encapsulation layer 500 can also be omitted. Even if cracks are generated when the display panel 100 is cut, the cracks do not extend to the display area A.

S520: forming the covering material film layer on the first touch encapsulation units 510 and the second touch encapsulation units 520 to form the covering unit 400.

In the present embodiment, step S510 can be performed or not performed, and step S520 can be performed or not performed. Combinations of steps can be: first: S510; second: S510, S520; and third: S500.

In the present embodiment, when the third combination is adopted, the manufacturing method of the display panel 100 further comprises:

S600: forming the touch encapsulation layer 500 on the covering unit 400.

In the present embodiment, step S600 comprises:

S610: forming the touch encapsulation material film layer on the covering unit 400.

S620: etching the touch encapsulation material film layer to form the touch encapsulation layer 500.

In the present embodiment, the encapsulation member further comprises the touch encapsulation layer 500 disposed on the covering unit 400, and the touch encapsulation layer 500 is also located in the display area A. An orthographic projection of the touch encapsulation layer 500 projected on the covering unit 400 in the peripheral area B is located within the covering unit 400. Please refer to FIG. 3 for details. The display panel 100 also comprises related structures of the touch encapsulation layer 500. The touch encapsulation layer 500 is located on the covering unit 400 and extends into the display area A to provide an encapsulation protection on a touch structure of the display panel 100. During manufacturing of the display panel 100, the touch encapsulation layer 500 is etched to etch away a portion of the touch encapsulation layer 500 away from the display area A. Therefore, when the display panel 100 is cut, the present application reduces a risk of cracking of the touch encapsulation layer 500 at locations of cutting, and fundamentally reduces a risk of cracks extending to the display area A of the display panel 100.

S700: cutting the display panel 100.

In the present invention, the barrier units with upper and lower end surfaces of different areas are arranged in the peripheral area. Accordingly, when the encapsulation film layers are formed, the encapsulation film layers are broken in the opening between each two adjacent barrier units. As a result, even if cracks are generated when the display panel is cut, the cracks do not extend to the display area, thus ensuring encapsulation effects and improving production yields of the display panel.

Referring to FIG. 9, the present invention also provides a mobile terminal 10, which comprises any above-mentioned display panel 100 and a terminal body 20. The terminal body 20 and the display panel 100 are combined into one body.

For the specific structure of the display panel 100, please refer to any of the above-mentioned embodiments of the display panel 100 and FIGS. 1 to 7, and a detailed description thereof is omitted herein for brevity.

In the present embodiment, the terminal body 20 can comprise a middle frame, a sealant, etc.; the present application is not limited in this regard.

The present invention discloses a display panel and a mobile terminal. The display panel comprises a display area and a peripheral area. The display panel comprises a substrate and an encapsulation component arranged in the peripheral area. The encapsulation component comprises a plurality of barrier units spaced apart from each other, an encapsulation member, and an opening defined between each two adjacent barrier units. The encapsulation member comprises a first array encapsulation unit disposed on each barrier unit and a second array encapsulation unit disposed in each opening. The first array encapsulation units and the second array encapsulation units are separate from each other. In each barrier unit, an area of an end surface of the barrier unit close to the substrate is smaller than an area of an end surface of the barrier unit away from the substrate. In the present invention, the barrier units with upper and lower end surfaces of different areas are arranged in the peripheral area. Accordingly, when encapsulation film layers are formed, the encapsulation film layers are broken in the opening between each two adjacent barrier units. Therefore, even if cracks are generated, the cracks do not extend to the display area, ensuring encapsulation effects.

It can be understood that, those of ordinary skill in the art can make equivalent replacements or changes according to the technical solution of the present application and its inventive concept. All these changes or replacements shall be deemed to fall within the protection scope of the appended claims of the present application.

What is claimed is:

1. A display panel, comprising:

a display area and a peripheral area arranged at a periphery of the display area;

a substrate and an encapsulation component arranged on the substrate in the peripheral area, wherein the encapsulation component comprises a plurality of barrier units spaced apart from each other, an encapsulation member, and an opening defined between each two adjacent ones of the barrier units; and the encapsulation member comprises a first array encapsulation unit arranged on each barrier unit and a second array encapsulation unit arranged in each opening; and an array substrate encapsulation layer disposed in the display area;

wherein the first array encapsulation unit and the second array encapsulation unit are separate from each other; and in each barrier unit, an area of an end surface of the barrier unit close to the substrate is smaller than an area of an end surface of the barrier unit away from the substrate;

wherein the barrier units comprise a first inorganic layer disposed on the substrate and a second inorganic layer disposed on the first inorganic layer; and a thickness of each first array encapsulation unit is equal to a thickness of each second array encapsulation unit;

wherein the display panel further comprises a covering unit arranged on the barrier units, and the covering unit fills the opening between each two adjacent ones of the barrier units;

wherein the encapsulation member further comprises a touch encapsulation layer disposed on the covering unit, the touch encapsulation layer is also located in the display area, and an orthographic projection of the touch encapsulation layer in the peripheral area projected on the covering unit is located within the covering unit, and an end of the touch encapsulation layer in the peripheral area is not flush with a corresponding end of the covering unit;

wherein at a junction between the display area and the peripheral area, the array substrate encapsulation layer is physically separated from the second array encapsulation unit by the opening most adjacent to the display area.

2. The display panel according to claim 1, wherein a thickness of the array substrate encapsulation layer is equal to the thickness of each first array encapsulation unit, and the thickness of the array substrate encapsulation layer is equal to the thickness of each second array encapsulation unit.

3. The display panel according to claim 2, further comprising a plurality of dams arranged between the second inorganic layer and the array substrate encapsulation layer and located on one side of the display area close to the peripheral area.

4. The display panel according to claim 1, wherein the encapsulation member further comprises a first touch encapsulation unit disposed on the first array encapsulation unit and a second touch encapsulation unit disposed on the second array encapsulation unit, and the first touch encapsulation unit and the second touch encapsulation unit are separate from each other.

5. The display panel according to claim 1, wherein each of the barrier units comprises a side wall, the side wall is disposed corresponding to one of the openings, and the side wall is an arc surface recessed toward a center of the barrier unit.

6. The display panel according to claim 1, wherein sizes of the openings gradually increase in a direction away from the display area.

7. The display panel according to claim 1, wherein the encapsulation member on one side close to the display area is connected to a plurality of encapsulation film layers in the display area.

8. A mobile terminal, comprising:

a display panel and a terminal body, wherein the terminal body and the display panel are combined into one body, and the display panel comprises a display area and a peripheral area arranged at a periphery of the display area;

wherein the display panel comprises a substrate and an encapsulation component arranged on the substrate in the peripheral area; the encapsulation component comprises a plurality of barrier units spaced apart from each other, an encapsulation member, and an opening defined between each two adjacent ones of the barrier units; and the encapsulation member comprises a first array encapsulation unit arranged on each barrier unit and a second array encapsulation unit arranged in each opening; and display panel further comprises an array substrate encapsulation layer disposed in the display area;

wherein the first array encapsulation unit and the second array encapsulation unit are separate from each other; and in each barrier unit, an area of an end surface of the barrier unit close to the substrate is smaller than an area of an end surface of the barrier unit away from the substrate;

wherein the barrier units comprise a first inorganic layer disposed on the substrate and a second inorganic layer disposed on the first inorganic layer; and a thickness of each first array encapsulation unit is equal to a thickness of each second array encapsulation unit;

wherein the display panel further comprises a covering unit arranged on the barrier units, and the covering unit fills the opening between each two adjacent ones of the barrier units;

wherein the encapsulation member further comprises a touch encapsulation layer disposed on the covering unit, the touch encapsulation layer is also located in the display area, and an orthographic projection of the touch encapsulation layer in the peripheral area projected on the covering unit is located within the covering unit, and an end of the touch encapsulation layer in the peripheral area is not flush with a corresponding end of the covering unit;

wherein at a junction between the display area and the peripheral area, the array substrate encapsulation layer is physically separated from the second array encapsulation unit by the opening most adjacent to the display area.

9. The mobile terminal according to claim 8, wherein a thickness of the array substrate encapsulation layer is same as the thickness of each first array encapsulation unit, and the thickness of the array substrate encapsulation layer is same as the thickness of each second array encapsulation unit.

10. The mobile terminal according to claim 9, wherein the display panel further comprises a plurality of dams arranged between the second inorganic layer and the array substrate encapsulation layer and located on one side of the display area close to the peripheral area.

11. The display panel according to claim 8, wherein the encapsulation member further comprises a first touch encapsulation unit disposed on the first array encapsulation unit and a second touch encapsulation unit disposed on the second array encapsulation unit, and the first touch encapsulation unit and the second touch encapsulation unit are separate from each other.

12. The mobile terminal according to claim 8, wherein each of the barrier units comprises a side wall, the side wall is disposed corresponding to one of the openings, and the side wall is an arc surface recessed toward a center of the barrier unit.

13. The mobile terminal according to claim 8, wherein sizes of the openings gradually increase in a direction away from the display area.

14. The mobile terminal according to claim 8, wherein the encapsulation member on one side close to the display area is connected to a plurality of encapsulation film layers in the display area.

* * * * *